(12) United States Patent
Skirmont et al.

(10) Patent No.: US 9,253,912 B2
(45) Date of Patent: Feb. 2, 2016

(54) EJECTOR AND CABLE MANAGEMENT SYSTEM AND METHOD

(71) Applicant: Brocade Communications Systems, Inc., San Jose, CA (US)

(72) Inventors: David Skirmont, Los Gatos, CA (US); Dan Kilkenny, Pleasanton, CA (US); Eric Farnholtz, Alamo, CA (US); Anthony Vanderveen, San Jose, CA (US); Peter Doyle, Los Altos, CA (US)

(73) Assignee: BROCADE COMMUNICATIONS SYSTEMS, INC., San Jose, CA (US)

( * ) Notice: Subject to any disclaimer, the term of this patent is extended or adjusted under 35 U.S.C. 154(b) by 13 days.

(21) Appl. No.: 14/331,864

(22) Filed: Jul. 15, 2014

(65) Prior Publication Data
US 2015/0181743 A1 Jun. 25, 2015

Related U.S. Application Data

(60) Provisional application No. 61/920,190, filed on Dec. 23, 2013.

(51) Int. Cl.
| H05K 5/00 | (2006.01) |
| H05K 7/16 | (2006.01) |
| H02B 1/01 | (2006.01) |
| H02B 1/20 | (2006.01) |
| A47F 7/00 | (2006.01) |
| H05K 7/14 | (2006.01) |
| H05K 5/02 | (2006.01) |

(52) U.S. Cl.
CPC ............ *H05K 7/1409* (2013.01); *H05K 5/0295* (2013.01); *H05K 7/1411* (2013.01); *H05K 7/1489* (2013.01); *H05K 7/1491* (2013.01)

(58) Field of Classification Search
CPC ... H02B 1/202; H05K 7/1409; H05K 7/1411; H05K 7/1489; H05K 7/1491; H05K 5/0295; H04Q 1/066
USPC .......... 361/724–727, 679.37–679.39, 361/825–826, 754, 759, 732, 740, 747; 211/26
See application file for complete search history.

(56) References Cited

U.S. PATENT DOCUMENTS

| 4,875,867 | A  |    | 10/1989 | Hoo |          |
| 5,530,302 | A  |    | 6/1996  | Hamre et al. | |
| 5,793,614 | A  | *  | 8/1998  | Tollbom ........... | H05K 7/1409 361/725 |
| 6,182,173 | B1 |    | 1/2001  | Grosser et al. | |
| 6,568,542 | B1 | *  | 5/2003  | Chen ................. | H04Q 1/06 211/26 |
| 6,956,745 | B2 | *  | 10/2005 | Kerrigan .......... | H05K 7/1489 312/223.1 |
| 7,125,272 | B1 | *  | 10/2006 | Liang .............. | H05K 7/1489 361/732 |
| 7,245,499 | B2 | *  | 7/2007  | Stahl .............. | H05K 7/1409 361/610 |
| 7,345,241 | B2 | *  | 3/2008  | Caveney .......... | H01R 9/2416 174/135 |

(Continued)

*Primary Examiner* — Nidhi Thaker
(74) *Attorney, Agent, or Firm* — Innovation Counsel LLP; Serge J. Hodgson

(57) ABSTRACT

An electronic device includes a blade having a faceplate and a handle out locked position ejector. The handle out locked position ejector is configured to secure the blade to a chassis. The handle out locked position ejector includes two ejectors and a handle binding the two ejectors together. The handle out locked position ejector extends perpendicularly from the faceplate when the blade is secured to the chassis thus locating the handle out of the way of ports of the blade.

13 Claims, 7 Drawing Sheets

(56) References Cited

U.S. PATENT DOCUMENTS

| | | | |
|---|---|---|---|
| 7,352,947 B2 * | 4/2008 | Phung | G02B 6/4459 248/49 |
| 7,404,736 B2 * | 7/2008 | Herbst | H04Q 1/13 439/557 |
| 8,410,364 B2 | 4/2013 | Dunwoody et al. | |
| 2006/0023430 A1 * | 2/2006 | Karstens | H05K 7/1409 361/732 |
| 2009/0034227 A1 * | 2/2009 | Mayer | H02G 15/007 361/826 |
| 2009/0086456 A1 * | 4/2009 | Milo | H05K 7/1409 361/801 |
| 2012/0012714 A1 | 1/2012 | Rubenstein et al. | |

* cited by examiner

EJECTOR AND CABLE MANAGEMENT SYSTEM AND METHOD

RELATED APPLICATIONS

This application claims the benefit of U.S. Provisional Application No. 61/920,190 filed on Dec. 23, 2013, entitled "EJECTOR AND CABLE MANAGEMENT SYSTEM AND METHOD" of Skirmont et al., which is incorporated herein by reference in its entirety.

BACKGROUND

1. Field

The present application relates to the field of electronics, and more particularly, to structures for electronic devices and related methods.

2. Description of the Related Art

An electronic device such as a switch includes various components that are housed within a chassis. The chassis forms the framework that supports the various components while allowing the various components to be inserted and removed from the electronic device.

One example of a component such as a blade includes ejector handles for securing the blade to the chassis. The blade is inserted into the chassis. After insertion of the blade, the ejector handles are pivoted to rest against the front face of the blade thus locking the blade to the chassis.

The front face of the blade includes various ports to which cables are connected. To maximize the utilization of the blade, the ports are provided in a high density on the front face of the blade to facilitate a high density of cable connections to the blade. Unfortunately, the ejector handles block valuable area of the front face thus limiting the port density on the front face.

Further, cable management is a challenge in a switch having a large number of blades. For example, cables connected to upper blades can droop and block access to ports of lower blades. As the density of cable connections increases, it becomes increasingly important to manage the cables.

SUMMARY

In accordance with one embodiment, an electronic device includes a blade having a faceplate and a handle out locked position ejector. The handle out locked position ejector is configured to secure the blade to a chassis. The handle out locked position ejector includes two ejectors and a handle binding the two ejectors together. The handle out locked position ejector extends perpendicularly from the faceplate when the blade is secured to the chassis thus locating the handle out of the way of ports of the blade.

In accordance with one embodiment, the electronic device includes two handle out locked position ejectors having handles. A cable management system is removable attached to the handles, e.g., by snapping the cable management system in place. Cables connected to ports of the blade are routed over, under, or otherwise supported by the cable management system.

These and other features in accordance with various embodiments will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
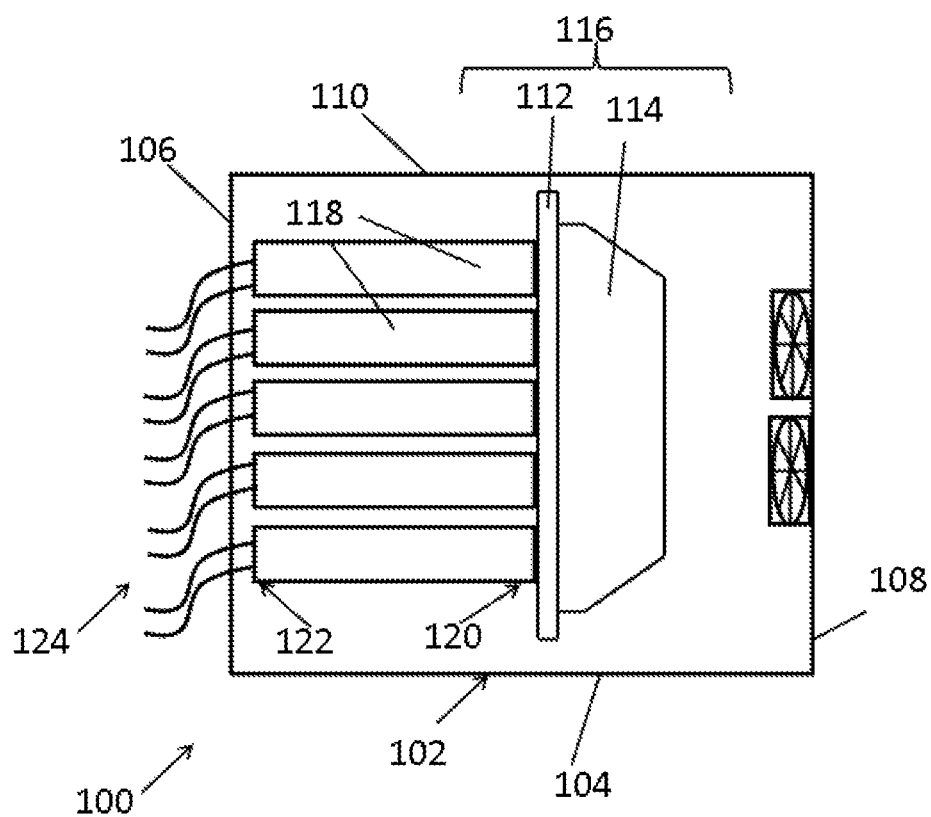
FIG. 1 is a side schematic diagram of an electronic device in accordance with one embodiment.

FIG. 1 is a side schematic diagram of an electronic device 100, e.g., a switch, in accordance with one embodiment. Electronic device 100 includes a chassis 102 that forms the framework that supports the various components of electronic device 100.

Generally, electronic device 100 includes a horizontal base 104, e.g., that extends in a first direction. Electronic device 100 further includes a vertical front face 106, e.g., that extends in a second direction perpendicular to the first direction of horizontal base 104. Electronic device 100 further includes a vertical rear face 108 that also extends in the second direction perpendicular to the first direction of horizontal base 104. For discussion purposes herein, front face 106 is in a vertical front plane of electronic device 100 and rear face 108 is an approximately parallel vertical rear plane of electronic device 100.

Electronic device 100 further includes a horizontal top 110 parallel to base 104 and perpendicular to faces 106, 108. Faces 106, 108 extend between base 104 and top 110. Although the terms vertical, horizontal and similar terms are used herein, the terms are used for simplicity to generally mean in a first direction and a perpendicular second direction and it is to be understood that the terms are not gravitationally referenced. Further, although various features may be described as parallel, perpendicular, or having other relations, it is to be understood that the features may not be exactly parallel or perpendicular but only substantially parallel or perpendicular.

Located within chassis 102 is a bulkhead 112. In one embodiment, bulkhead 112 is a flat plate, e.g., a machined aluminum plate, extending in the vertical direction. Bulkhead 112 includes cutouts and other openings to accommodate various components of electronic device 100.

One or more cable cassettes 114 are coupled to bulkhead 112. Cable cassettes 114 include internal cabling and connectors that mount to the cutouts in bulkhead 112. This cabling allows high speed signal propagation thus allowing the size of electronic device 100 to be relatively large, i.e., to accommodate a large number of components.

Further, bulkhead 112 and cable cassettes 114 form a bulkhead assembly 116 that replaces a traditional PCB backplane from the standpoint of the customer, e.g., the user of electronic device 100. More particularly, one or more blades 118, e.g., line cards, switch fabrics, and/or management modules, can be readily connected to and disconnected from bulkhead assembly 116.

Although a bulkhead assembly 116 is illustrated, in another embodiment, a traditional PCB backplane as those of skill in the art will understand in light of this disclosure is used instead of bulkhead assembly 116.

Blades 118 include bulkhead assembly connector ends 120 and opposite wiring ends 122. Bulkhead assembly connector ends 120 mechanically and electrically interconnect with bulkhead assembly 116.

Wiring ends 122 include various ports or other data communication structures as well as mechanical structures, e.g., ejector handles, to allow securement and removal of blades 118 from chassis 102. For example, external cabling 124 is connected to blades 118 at wiring ends 122.

Figure 2:
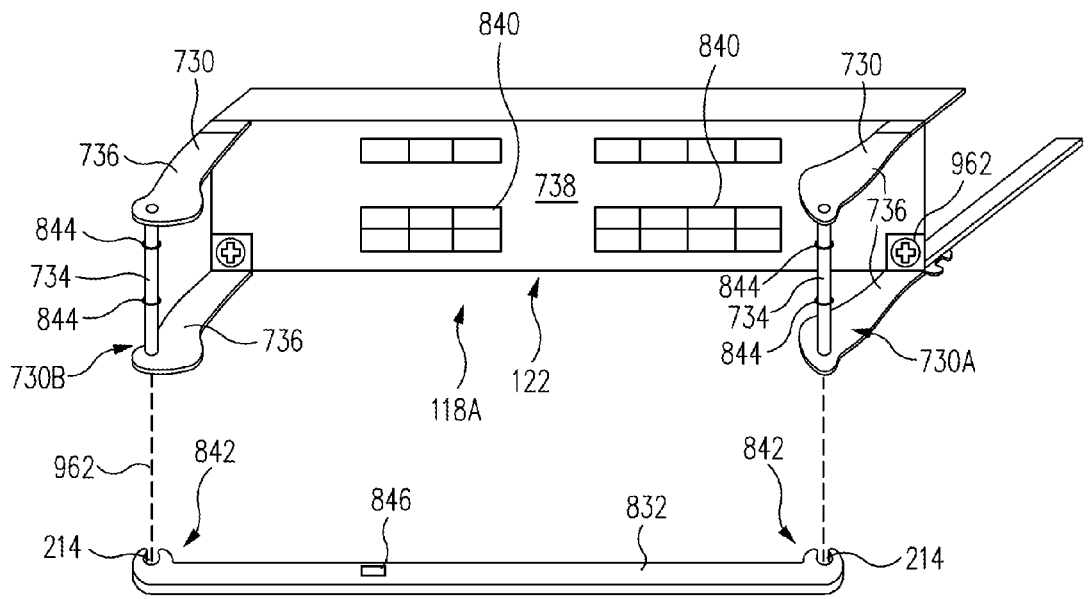
FIG. 2 is a front perspective view of a blade having handle out locked position ejectors in the closed position and including a cable management system in accordance with one embodiment.
Figure 3:
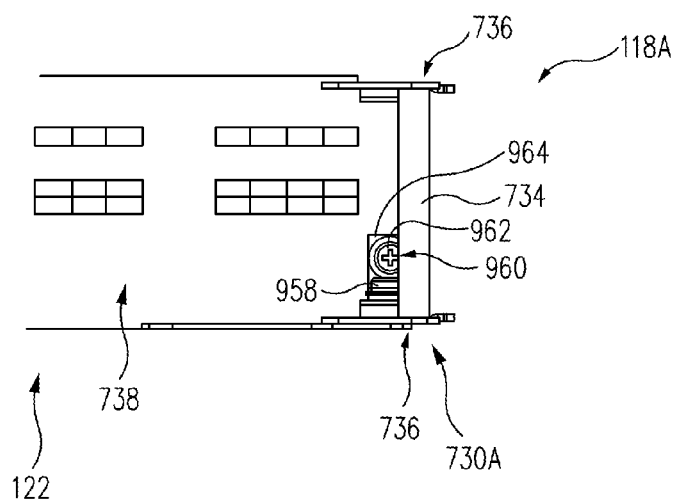
FIG. 3 is a front plan view of a portion of the blade of FIG. 2 in accordance with one embodiment.
Figure 4:
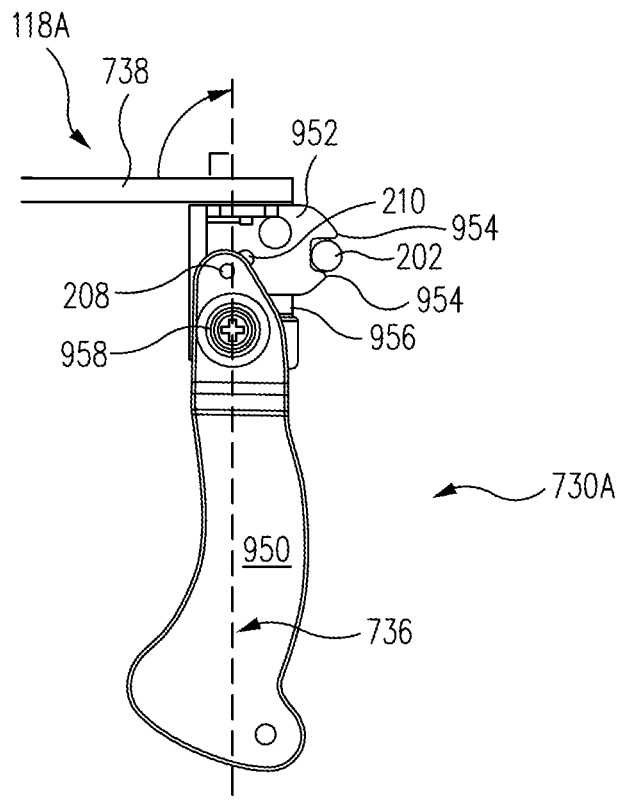
FIG. 4 is a top plan view of a handle out locked position ejector of the blade of FIG. 2 in the closed position in accordance with one embodiment.
Figure 6:
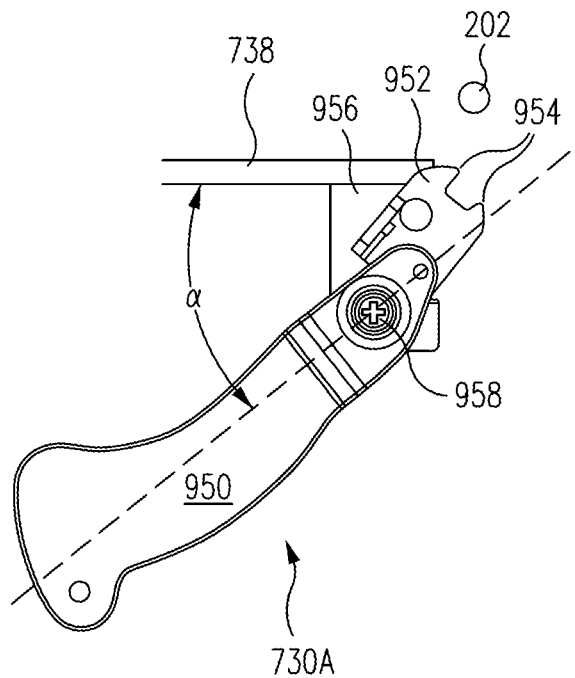
FIG. 6 is a top plan view of the handle out locked position ejector of the blade of FIG. 2 in the open position in accordance with one embodiment.
Figure 5:
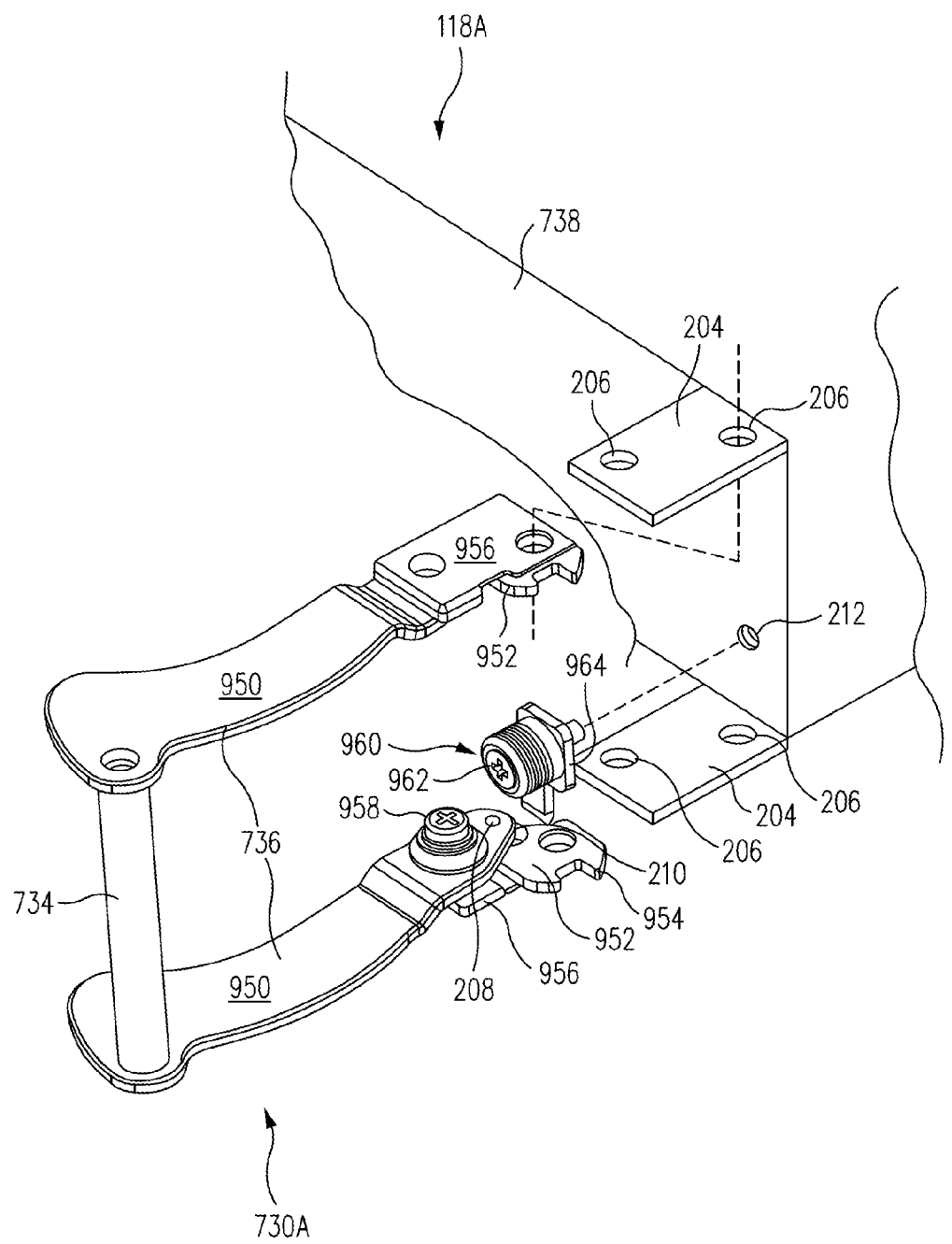
FIG. 5 is an exploded perspective view of the handle out locked position ejector in the closed position and a faceplate of the blade of FIG. 2 in accordance with one embodiment.

FIG. 2 is a front perspective view of a blade 118A having handle out locked position ejectors 730 in the closed position and including a cable management system 832 in accordance with one embodiment. FIG. 3 is a front plan view of a portion of blade 118A of FIG. 2 in accordance with one embodiment. FIG. 4 is a top plan view of a handle out locked position ejector 730A of blade 118A of FIG. 2 in the closed position in accordance with one embodiment. FIG. 5 is an exploded perspective view of handle out locked position ejector 730A in the closed position and a faceplate 738 of blade 118A of FIG. 2 in accordance with one embodiment. FIG. 6 is a top plan view of handle out locked position ejector 730A of blade 118A of FIG. 2 in the open position in accordance with one embodiment. The open position is defined further below.

Referring to FIGS. 1-6 together, in one embodiment, blade 118A is representative of one of blades 118 as illustrated in FIG. 1. Blade 118A includes a bulkhead assembly connector end 120 (not shown) mechanically and electrically interconnect with bulkhead assembly 116 when installed within chassis 102.

Blade 118A further includes a wiring end 122 which is the end illustrated in FIGS. 2-6. Blade 118A contains ports 840 at wiring end 122 into which transceiver modules are placed or connected. The transceiver modules have optical fiber connections, but also have copper cables in other embodiments.

Blade 118A includes handle out locked position ejectors 730A, 730B, collective referred to as handle out locked position ejectors 730. Handle out locked position ejector 730A shall be described in further detail and it is to be understood that the discussion is equally applicable to handle out locked position ejector 730B.

Handle out locked position ejector 730A has a mechanical attachment bar 734 and two ejectors 736. Mechanical attachment bar 734 is coupled to and extends between ejectors 736 thus binding ejectors 736 together. Mechanical attachment bar 734, sometimes called a handle, allows for ejectors 736 to be actuated simultaneously.

Further, when in the closed position as illustrated in FIGS. 2-5, handle out locked position ejector 730A locks blade 118A in place, e.g., to a locking feature 202 of chassis 102. Although locking feature 202 is illustrated as a being circular when viewed from above in the view of FIGS. 4, 6, in other embodiments, locking feature 202 has any one of a number of shapes that engage with handle out locked position ejector 730A.

Handle out locked position ejector 730A is in the closed position when handle out locked position ejector 730A extends perpendicularly outward from faceplate 738 of blade 118A as illustrated in FIGS. 2-5.

In contrast, handle out locked position ejector 730A unlocks blade 118A, e.g., from chassis 102, when handle out locked position ejector 730A is moved from the closed position as illustrated in FIGS. 2-5 to the open position as illustrated in FIG. 6. Generally, when in the close position as illustrated in FIGS. 2-5, blade 118A is locked in place, e.g., to locking feature 202 of chassis 102. In the open position as illustrated in FIG. 6, blade 118A is unlocked from position, e.g., disengaged from locking feature 202 of chassis 102. The open position occurs upon disengagement from locking feature 202 and it is to be understood that the open position includes a range from partially open to completely open as long as locking feature 202 is disengaged.

In the open position, handle out locked position ejector 730A lies close to and is non-perpendicular to faceplate 738 of blade 118A. More particularly, as illustrated in FIG. 6, an angle $\alpha$ exists between handle out locked position ejector 730A and faceplate 738, where angle $\alpha$ is less than 90°. FIG. 6 may represent a case when handle out locked position ejector 730A is partially open. For example, in one embodiment, handle out locked position ejector 730A is capable of additional rotation beyond that shown in FIG. 6 such that the angle between handle out locked position ejector 730A and faceplate 738 is less than angle $\alpha$ in the completely open position.

This counter rotating aspect of handle out locked position ejectors 730 eliminates interference with the media and cables by having the closed position, sometimes called the inserted position, of handle out locked position ejectors 730 be perpendicular to faceplate 738 of blade 118A. Specifically, mechanical attachment bar 734 is located at the sides of faceplate 738 thus allowing full access to ports 840 of blade 118A when blade 118A is locked to chassis 102.

Each ejector 736 includes an ejector handle 950 and an ejector cam and tooth 952. Ejector cam and tooth 952 includes an ejector tooth 954 that engages and disengages locking feature 202 of chassis 102 as ejectors 736 are moved to the closed position and open position, respectively.

Ejector handle 950 is coupled to ejector cam and tooth 952 such that motion of ejector handle 950 causes motion of ejector cam and tooth 952. In one embodiment, as illustrated in FIGS. 2-5, ejector handle 950 is in the closed position and extends perpendicular from faceplate 738, sometimes called the face, of blade 118A. When ejector handle 950 is in the closed position, ejector cam and tooth 952 is position such that ejector tooth 954 is positioned perpendicularly to the length of ejector handle 950 and outwardly parallel to faceplate 738. This allows ejector tooth 954 to engage locking feature 202 of chassis 102 and lock blade 118A in position.

In contrast, as illustrated in FIG. 6, ejector handle 950 is in the open position, e.g., partially open, and extends non-perpendicularly at angle $\alpha$ to faceplate 738 of blade 118A. When ejector handle 950 is in the open position, ejector cam and tooth 952 is position such that ejector tooth 954 is positioned parallel to the length of ejector handle 950 and extends at an angle relative to faceplate 738. This allows ejector tooth 954 to disengage locking feature 202 of chassis 102 and unlock blade 118A for removal. As mentioned above, in one embodiment, ejector handle 950 can be further rotated such that the angle between ejector handle 950 and faceplate 738 is less than angle α. Accordingly, ejector tooth 954 is not necessarily positioned parallel to the length of ejector handle ejector handle 950 when ejector handle 950 is in the open position.

In one embodiment, each ejector 736 includes a fixed plate 956, e.g., that is screwed to blade 118A, e.g., with screws 958 (only a single screw 958 is illustrated but there can be more than one screw 958 for each fixed plate 956). Ejector handle 950 and ejector cam and tooth 952 are pivotally attached to fixed plate 956.

In one embodiment, paying particular attention to FIG. 5, ejector mounting flanges 204 are fixed to and protrude outwards from faceplate 738 or otherwise from blade 118A. Ejector mounting flanges 204 include apertures 206, e.g., threaded apertures, into which screws 958 are threaded. Fixed plates 956 are mounted to ejector mounting flanges 204 and thus are fixed in position with relation to blade 118A. Although ejector mounting flanges 204 are illustrated in FIG. 5, in other embodiments, fixed plates 956 have flanges or other features that are mounted directly to faceplate 738 and ejector mounting flanges 204 not provided.

Paying particular attention to the example shown in FIG. 5, screw 958 passes through an opening in ejector handle 950, a corresponding opening in fixed plate 956, and into a corresponding aperture 206 of a corresponding ejector mounting flange 204. Accordingly, ejector handle 950 pivots around screw 958. Ejector cam and tooth 952 is pivotally attached to fixed plate 956 in a similar manner in one embodiment.

Further, there is an engagement mechanism, e.g., a cam feature, between ejector handle 950 and ejector cam and tooth 952 that causes ejector cam and tooth 952 to pivot as ejector handle 950 pivots. In one embodiment, a cam feature is used as the engagement mechanism that provides mechanical advantage in pivoting ejector cam and tooth 952.

For example, a protruding pin 208 from ejector handle 950 is located within a slot 210 of ejector cam and tooth 952 or vice versa. However, other engagement mechanisms are used in other embodiments and the pin in slot example is simply illustrative.

Generally, ejector cam and tooth 952 pivots in the opposite direction as ejector handle 950. Accordingly, ejector handle 950 is sometimes called a counter rotating handle.

To illustrate, ejector cam and tooth 952 pivots in the clockwise direction when viewed from above when ejector handle 950 is pivoted counterclockwise from the open position to the closed position. Counterclockwise is sometimes called a first direction and clockwise is sometimes called a second direction opposite the first direction, or vice versa. Conversely, ejector cam and tooth 952 pivots in the counterclockwise direction when viewed from above when ejector handle 950 is pivoted clockwise from the closed position to the open position.

In one embodiment, ejector cam and tooth 952 of the lower ejector 736 further includes a locking mechanism 960, sometimes called a threaded locking feature. Locking mechanism 960 includes a threaded screw 962 coupled to a locking mechanism flange 964 of ejector cam and tooth 952.

When ejector cam and tooth 952 is pivoted into the closed position as illustrated in FIGS. 3-5, threaded screw 962 is brought into alignment with a corresponding threaded aperture 212 of blade 118A, e.g., in faceplate 738. Threaded screw 962 is threaded (unthreaded) into threaded aperture 212 to lock (release) handle out locked position ejector 730A.

In one embodiment, a sensor, e.g., a mechanical or optical switch, senses whether threaded screw 962 is threaded or unthreaded from threaded aperture 212 of blade 118A. In one particular embodiment, the sensor senses when threaded screw 962 is unthreaded and provides advanced notice that blade 118A is to be removed to allow electronic device 100 time to take appropriate action to prevent data loss. Stated another way, the threaded locking feature interfaces with a switch, e.g., an optical switch, that allow for a time delay when removing blade 118A from the system providing no loss of data.

Paying particular attention to FIG. 2, blade 118A with the double handle ejector system comprising handle out locked position ejectors 730 is illustrated. Ejectors 730 have tie-bars 734, sometimes called mechanical attachment bars 734 or handles, linking the two ejectors 736 on the same end of blade 118A.

Managing the cables is always a challenge, copper or fiber. Horizontal blades have a greater challenge due to the tendency for the cables to droop and block access to lower blades.

Thus, in accordance with this embodiment, cable management system 832 that attaches to tie-bars 734 on the handle out locked position ejectors 730 is provided.

Cable management system 832 is a bar generally rectangular in cross section with stiffening elements, e.g., ribs, in one embodiment. In one embodiment, cable management system 832 is plastic but can be other materials in other embodiments. The ends 842 of cable management system 832 are a shape that can snap on and off tie-bars 734. A "C" section, sometimes called a snapping feature, is used here for illustration.

In one embodiment, tie-bars 734 are cylindrical. Ends 842 of cable management system 832 include C shaped openings 214 that are in a C shape, sometimes called a "C" section. The entrances into C shaped openings 214 are slightly smaller than the diameter of tie-bars 734 such that some force is required to pass tie-bars 734 through the entrances and into C shaped openings 214. In one embodiment, cable management system 832 is moved in a direction substantially perpendicular to the length of cable management system 832 to force tie-bars 734 into C shaped openings 214.

As tie-bars 734 are forced into C shaped openings 214, the entrances are slightly expanded and then contracted after the maximum diameter of tie-bars 734 passes through the entrances to C shaped openings 214. Accordingly, ends 842 of cable management system 832 snap on and off tie-bars 734.

The cable management system 832, sometimes called a cable management bar 832, is placed on tie-bars 734 once blade 118A is installed and the handle out locked position ejectors 730 are locked into the closed position. There are locking features 844, e.g., ridges, notches, rings, or other features, on tie-bars 734 to constrain the location of cable management system 832 in one embodiment. Locking features 844 are protrusions that protrude from tie-bars 734. For simplicity, locking features 844 are only illustrated in FIG. 2.

The height of cable management bar 832 is designed to be at heights useful for the different module types that may be associated with blade 118A. Blade 118A has only one associated module type in one embodiment, although there are many types of modules associated with blade 118A in other embodiments. The tie-bar design of tie-bars 734 and its features is specific to certain modules for a given blade 118A in one example.

Figure 7:
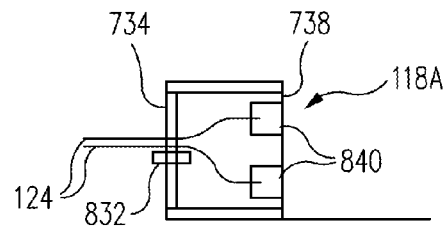
FIGS. 7, 8, 9, are side plan views illustrating a blade including cabling in accordance with various embodiments.
Figure 8:
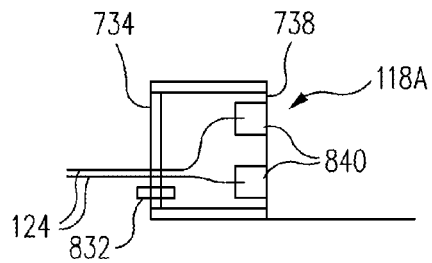
Figure 9:
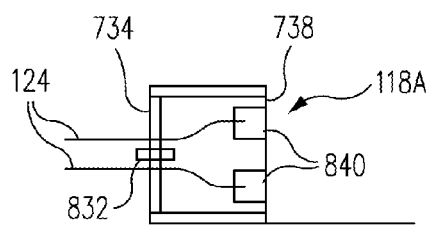
Figure 10:
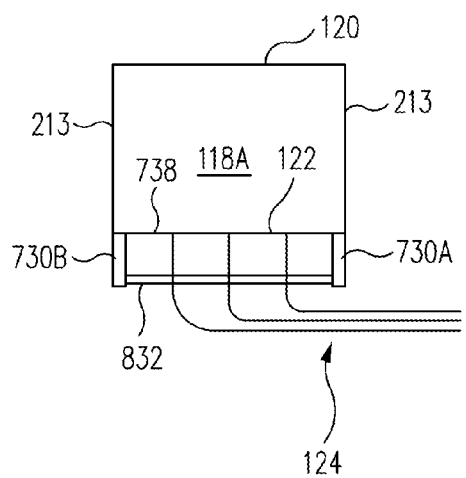
FIGS. 10, 11 are top plan views illustrating a blade including cabling in accordance with various embodiments.
Figure 11:
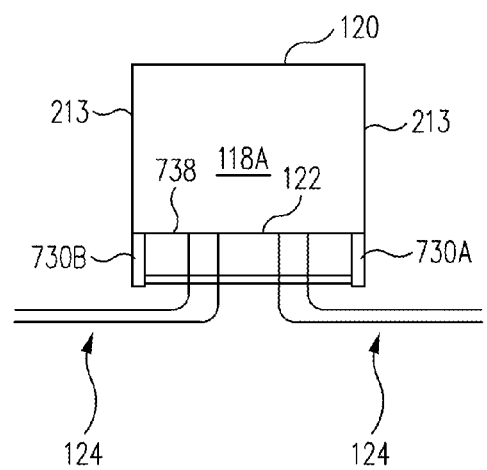

FIGS. 7, 8, 9, are side plan views illustrating blade 118A including cabling 124 in accordance with various embodiments. FIGS. 10, 11 are top plan views illustrating blade 118A including cabling 124 in accordance with various embodiments. Referring to FIGS. 2, 7-11 together, once cable management system 832 is installed, the modules are connected and cables 124 are routed over, under, or otherwise supported by cable management system 832. Cabling 124 is connector to ports 840 in one embodiment.

Cables 124 are dressed to the right, left, or however the user wishes as illustrated by the various examples in FIGS. 7-11. Cable management system 832 has holes 846, sometimes called apertures, to be used for securing the cable attachments, e.g., cables 124, as illustrated in FIG. 2 in one embodiment. Cables 124 are secured to cable management system 832 with Velcro, string, wire, or any other securing device.

For example, as illustrated in FIG. 7, cable management system 832 is located at a height at approximately the middle of tie-bars 734. Further, cables 124 are routed over cable management system 832.

In the example of FIG. 8, cable management system 832 is located at a height at approximately the bottom of tie-bars 734. Further, cables 124 are routed over cable management system 832.

In the example of FIG. 9, cable management system 832 is located at a height at approximately the middle of tie-bars 734. Further, cables 124 are routed above and below cable management system 832.

In the example of FIG. 10, cables 124 are coupled to cable management system 832 and routed with the same side egress, e.g., from the right of blade 118A.

In the example of FIG. 11, cables 124 are coupled to cable management system 832 and routed with the opposite side egress, e.g., from the right and left of blade 118A. As illustrated in FIGS. 10, 11, blade 118A includes sides 213 extending perpendicularly between wiring ends 122 and bulkhead assembly connector ends 120.

Although various examples are set forth in FIGS. 7-11, cables 124 are coupled to cable management system 832 and routed in any one of a number of configurations depending upon the particular application.

Figure 12:
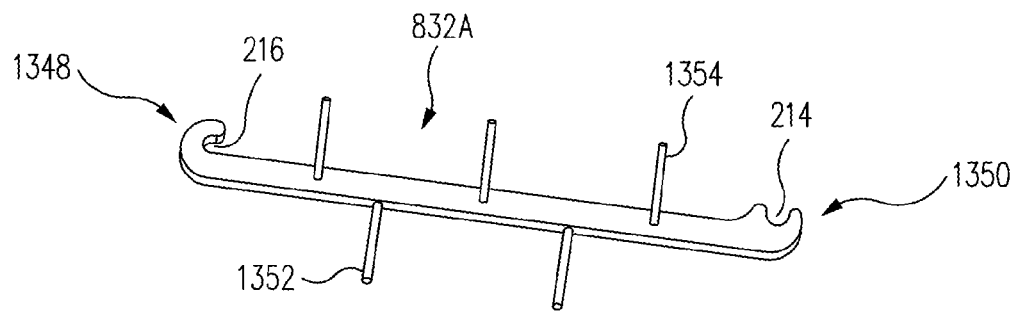
FIG. 12 is a perspective view of a cable management system in accordance with one embodiment.

FIG. 12 is a perspective view of cable management system 832A in accordance with one embodiment. In accordance with this embodiment, one end 1348 of cable management system 832A is more captive while the other end 1350 has a snap feature in one embodiment. For example, captive end 1348 has a slot like opening 216 extending in a direction substantially parallel to the length of cable management system 832A.

Accordingly, a first tie-bar 734 is inserted into slot like opening 216 at captive end 1348 by moving cable management system 832A in a direction substantially parallel to the length of cable management system 832A. A C shaped opening 214 is located at snapping end 1350 and is snapped to the respective second tie-bar 734 after the first tie-bar 734 is inserted into slot like opening 216. C shaped opening 214 of cable management system 832A is similar to C shaped openings 214 as described above in regards to cable management system 832.

Cable management system 832A has horizontal components 1352 and/or vertical components 1354, sometimes called combs or protruding features, for better cable support in the embodiment illustrated in FIG. 12. More particularly, referring to FIGS. 2 and 12 together, vertical components 1354 extend vertically and in a direction parallel to faceplate 738 of blade 118A. Further, horizontal components 1352 extend horizontally and in a direction perpendicular to faceplate 738 of blade 118A. Horizontal components 1352 and/or vertical components 1354 support cabling 124, e.g., prevent cabling 124 from sliding along cable management system 832A.

Figure 13:
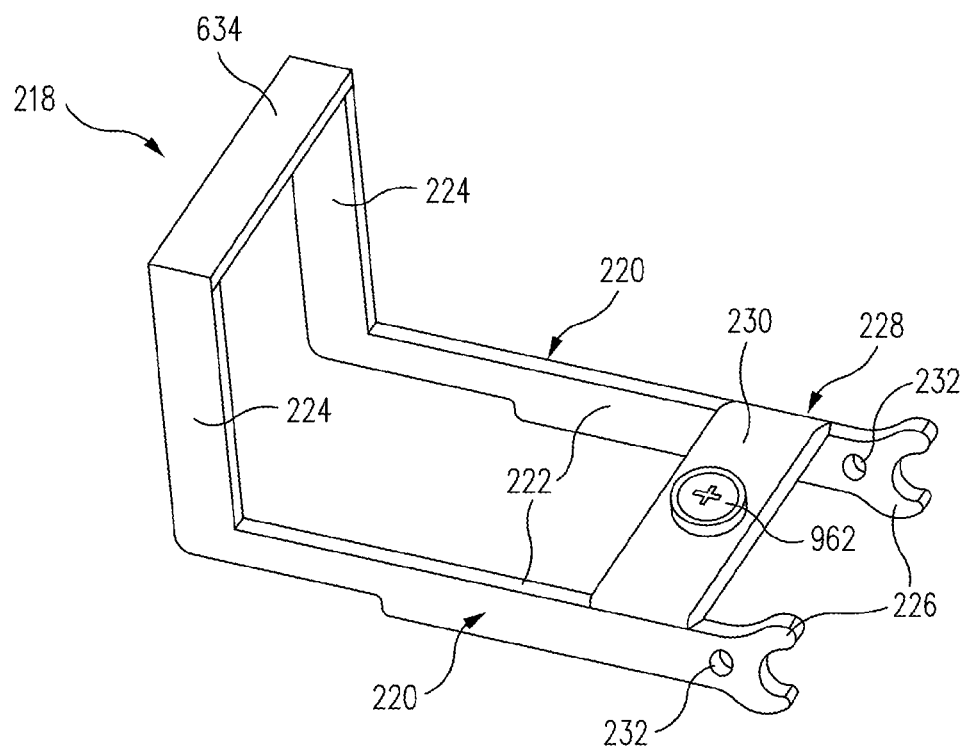
FIG. 13 is a perspective view of a double sided raised arm elector in accordance with one embodiment.
Figure 14:
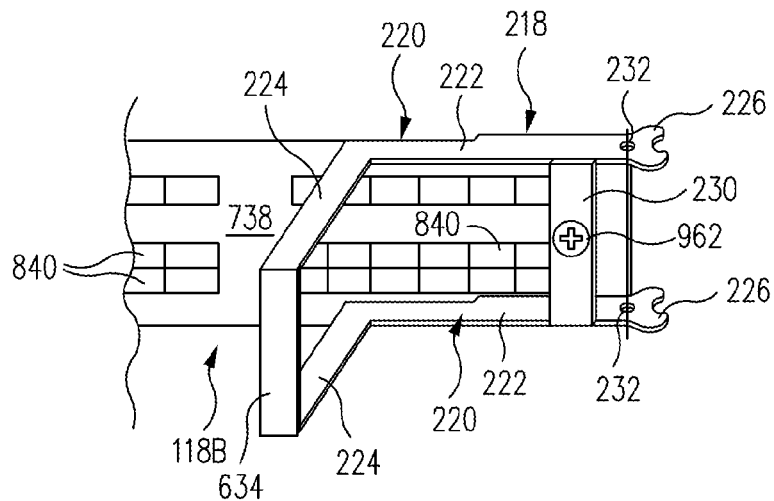
FIG. 14 is a perspective view of a blade having the double sided raised arm ejector of FIG. 13 in the closed position in accordance with one embodiment.

FIG. 13 is a perspective view of a double sided raised arm ejector 218, sometimes called a double ejector, in accordance with one embodiment. FIG. 14 is a perspective view of a blade 118B having double sided raised arm ejector 218 in the closed position in accordance with one embodiment.

Double-sided raised arm ejector 218 has a mechanical attachment arm 634 and two ejectors 220. Mechanical attachment arm 634, sometimes called a mechanical attachment bar 634 or handle, is coupled to and extends between ejectors 220 thus binding ejectors 220 together. Mechanical attachment arm 634 allows for ejectors 220 to be actuated simultaneously.

Each ejector 220 includes an ejector arm 222, a mechanical attachment arm extension 224, and an ejector tooth 226. Ejector arm 222 extends from ejector tooth 226 to mechanical attachment arm extension 224. Mechanical attachment arm extension 224 extends perpendicularly and at an angle from ejector arm 222 to mechanical attachment arm 634.

Double sided raised arm ejector 218 is in the closed position when ejector arms 222 extend substantially parallel to and along faceplate 738 of blade 118B as illustrated in FIG. 14. When in the closed position, mechanical attachment arm extensions 224 extends substantially perpendicularly from faceplate 738 to mechanical attachment arm 634.

Accordingly, mechanical attachment arm 634 is spaced apart from faceplate 738 including ports 840. In this manner, mechanical attachment arm 634 is prevented from blocking access to ports 840, i.e., mechanical attachment arm 634 is raised above the media thus avoiding blockage thereof. Stated another way, mechanical attachment arm 634 leaves ports 840 unobstructed.

Double sided raised arm ejector 218 includes a locking mechanism 228 includes a threaded screw 962 coupled to a locking mechanism flange 230. Locking mechanism flange 230 extends between ejector arms 222 adjacent ejector teeth 226 and supports threaded screw 962.

Double sided raised arm ejector 218 further includes pivot holes 232 through which a rod or other pivot structure is inserted. Double sided raised arm ejector 218 pivots between the open and closed positions on the pivot structure located within pivot holes 232.

When double sided raised arm ejector 218 is pivoted into the closed position as illustrated in FIG. 14, threaded screw 962 is brought into alignment with a corresponding threaded aperture of the blade 118B (see threaded aperture 212 of blade 118A of FIG. 5 for example). Threaded screw 962 is threaded (unthreaded) into the threaded aperture to lock (release) double sided raised arm ejector 218 in a manner similar to that described above regarding threaded screw 962 of FIG. 5. In one embodiment, a sensor, e.g., a mechanical or optical switch, senses whether threaded screw 962 is threaded or unthreaded to allow appropriate action to be taken as discussed above.

Figure 15:
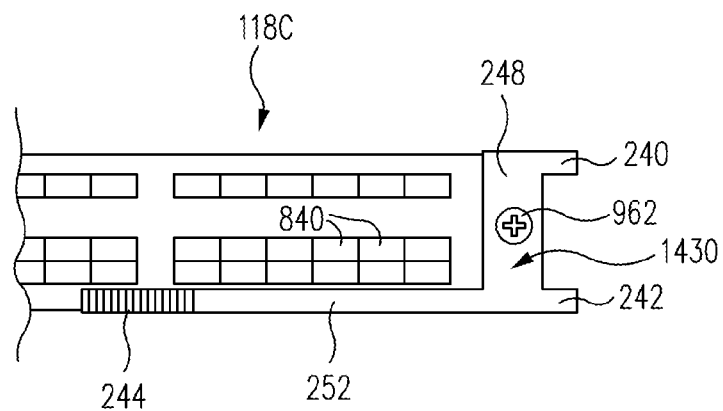
FIG. 15 is a front plan view of a blade having a double ejector in the closed position in accordance with one embodiment.
Figure 16:
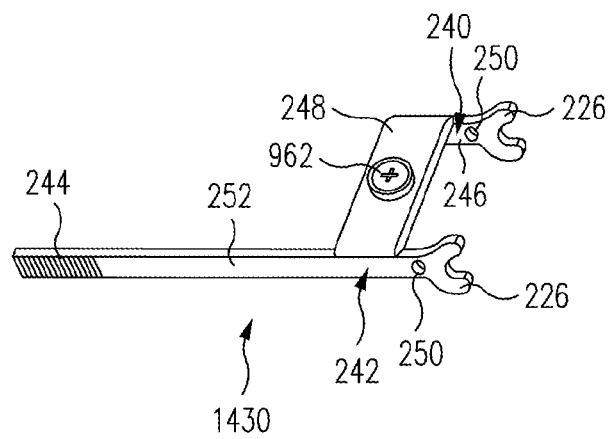
FIG. 16 is a perspective view of the double ejector of the blade of FIG. 15 in accordance with one embodiment.

FIG. 15 is a front plan view of a blade 118C having a double ejector 1430 in the closed position in accordance with one embodiment. FIG. 16 is a perspective view of double ejector 1430 of blade 118C of FIG. 15 in accordance with one embodiment. Double ejector 1430 is stamped and formed in one embodiment but is formed using other techniques in other embodiments, e.g., is diecast.

Double ejector 1430 includes two ejectors 240, 242 but includes a single handle 244 coupled to both the ejectors 240, 242. Stated another way, double ejector 1430 bridges the double ejectors 240, 242 together and allows them to function together as one.

Ejector 240 includes an ejector arm 246 and an ejector tooth 226. Ejector arm 246 extends from ejector tooth 226 to a mechanical attachment bar 248. Ejector 240 further includes a pivot hole 250 formed in ejector arm 246 through which a rod or other pivot structure is inserted.

Ejector 242 includes an ejector arm 252 and an ejector tooth 226. Ejector arm 252 extends from ejector tooth 226 to handle 244. In one embodiment, ejector arm 252 and handle 244 are regions of a single linear piece.

Ejector 242 further includes a pivot hole 250 formed in ejector arm 252 through which a rod or other pivot structure is inserted. Double ejector 1430 pivots between the open and closed positions on the pivot structure located within pivot holes 250.

Ejector 242 is coupled to mechanical attachment bar 248 between ejector tooth 226 and handle 244. In accordance with this embodiment, mechanical attachment bar 248 support threaded screw 962 and also binds ejectors 240, 242 together.

When double ejector 1430 is pivoted into the closed position as illustrated in FIG. 15, threaded screw 962 is brought into alignment with a corresponding threaded aperture of blade 118C (see threaded aperture 212 of blade 118A of FIG. 5 for example). Threaded screw 962 is threaded (unthreaded) into the threaded aperture to lock (release) double ejector 1430 in a manner similar to that described above regarding threaded screw 962 of FIG. 5. In one embodiment, a sensor, e.g., a mechanical or optical switch, senses whether threaded screw 962 is threaded or unthreaded to allow appropriate action to be taken as discussed above.

In one embodiment, double ejector 1430 includes sheet metal but is other materials, e.g., with a greater strength than sheet metal, in other embodiments.

Double ejector 1430 is a single handle double ejector that provides greater mechanical advantage, e.g., the longer handle 244 creates greater leverage. Further, double ejector 1430 does not block media access, e.g., ports 840, at any time during opening or closing of double ejector 1430. In particular, mechanical attachment arm 634 and handle 244 leaves ports 840 unobstructed.

Thus, cables 124 do not have to be removed to slide blade 118C in/out of the system. In various embodiments, cables 124 may have to be move around or be slightly displaced as any of the ejectors described above operate. However, the design and dimensions of the ejectors are such that the ejectors do not interfere with immovable components of the ports and cables.

The drawings and the forgoing description gave examples of embodiments. The scope of the embodiments, however, is by no means limited by these specific examples. Numerous variations, whether explicitly given in the specification or not, such as differences in structure, dimension, and use of material, are possible.

What is claimed is:

1. An electronic device comprising: a blade comprising: a faceplate; and a handle out locked position ejector configured to secure the blade to a chassis, the handle out locked position ejector extending outwardly from the faceplate when the handle out locked position ejector is in a closed position, the handle out locked position ejector comprising: two ejectors; and a mechanical attachment bar binding the two ejectors together; wherein the handle out locked position elector extends perpendicularly from the faceplate when the handle out locked position elector is in the closed position; and wherein the blade is locked to the chassis when the handle out locked position elector is in the closed position.

2. The electronic device of claim 1 wherein each ejector comprises:
an ejector handle; and
an ejector cam and tooth.

3. The electronic device of claim 2 wherein the ejector cam and tooth comprises an ejector tooth configured to engage a locking feature of the chassis.

4. The electronic device of claim 2 wherein the ejector handle is coupled to the ejector cam and tooth such that motion of the ejector handle causes motion of the ejector cam and tooth.

5. The electronic device of claim 4 wherein pivoting of the ejector handle in a first direction causes pivoting of the ejector cam and tooth in a second direction opposite the first direction.

6. The electronic device of claim 2 wherein the ejector cam and tooth comprises a locking mechanism for locking the handle out locked position ejector in place, the electronic device further comprising a sensor to sense a position of the locking mechanism.

7. An electronic device comprising: a blade comprising two handle out locked position ejectors comprising mechanical attachment bars; and a cable management system removably attached to the mechanical attachment bars; wherein each of the handle out locked position electors comprises: two electors; and one of the mechanical attachment bars binding the two electors together; and wherein the cable management system has snapping features configured to snap on and off the mechanical attachment bars.

8. The electronic device of claim 7 wherein the cable management system comprises a captive end and a snapping end.

9. The electronic device of claim 8 wherein the captive end comprises a slot like feature.

10. The electronic device of claim 8 wherein the snapping end comprises a C shaped opening.

11. The electronic device of claim 7 further comprising:
cabling coupled to ports of the blade, the cabling being supported by the cable management system.

12. The electronic device of claim 7 wherein the cable management system comprises apertures configured to secure cables.

13. The electronic device of claim 7 wherein the mechanical attachment bars comprise at least one protruding feature.

* * * * *